United States Patent [19]

Avins

[11] 4,308,500
[45] Dec. 29, 1981

[54] INCREMENTAL ENCODER FOR MEASURING POSITIONS OF OBJECTS SUCH AS ROTATING SHAFTS

[75] Inventor: Jeremiah Y. Avins, Kendall Park, N.J.

[73] Assignee: RCA Corporation, New York, N.Y.

[21] Appl. No.: 103,443

[22] Filed: Dec. 14, 1979

[51] Int. Cl.³ .............................................. H03D 13/00
[52] U.S. Cl. ..................................... 328/133; 307/514; 250/231 SE; 177/DIG. 3; 340/347 M; 340/347 P
[58] Field of Search ....................... 340/347 M, 347 P; 250/231 SE; 177/210 R, DIG. 3; 328/133; 307/232

[56] References Cited

U.S. PATENT DOCUMENTS

| | | | |
|---|---|---|---|
| 4,079,251 | 3/1978 | Osann | 250/231 SE |
| 4,094,371 | 6/1978 | Ferrell | 177/210 R |
| 4,246,497 | 1/1981 | Lawson et al. | 328/133 X |

Primary Examiner—Thomas J. Sloyan
Attorney, Agent, or Firm—Samuel Cohen; Robert L. Troike; Donald W. Phillion

[57] ABSTRACT

A circuit for determining each level transition of first and second two logic level input signals and their leading or lagging phase relationship at each level transition and comprising first and second signal level storage means each having first input means responsive to the first and second input signals, respectively, first output means, and clock input means and responsive to a clock signal supplied to the clock input means to cause the logic level on its output means to become equal to the logic level on its first input means. First and second Exclusive OR gates each have a first input means connected respectively to said first input means of said first and second signal level storage means, and a second input means connected respectively to said first output means of said first and second signal level storage means. A third Exclusive OR gate responds to equal or non-equal logic levels on said first output terminal of said first Exclusive OR gate and said second input signal to produce first and second logic level, respectively. Additional means respond to the outputs of said first, second, and third Exclusive OR gates to determine the relationship of said first and second input signals at each level transition thereof and to supply a clock signal to the clock input means of said first and second signal level storage means after said additional means determines the phase relationship between said first and second input signals.

9 Claims, 6 Drawing Figures

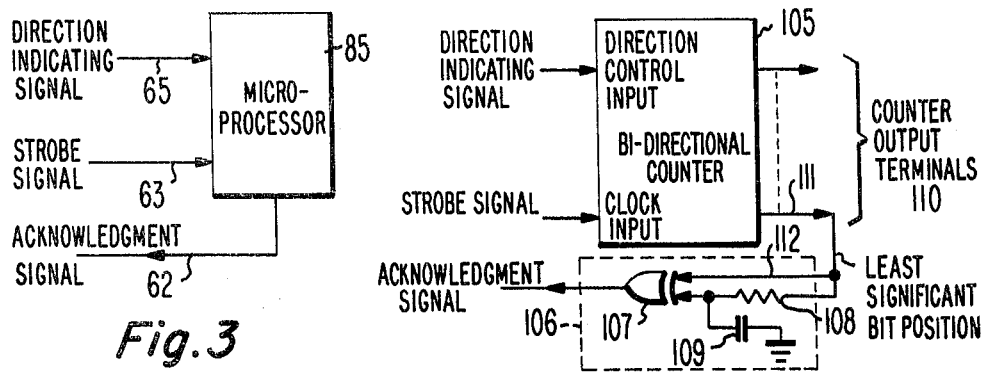
Fig.3
Fig.4
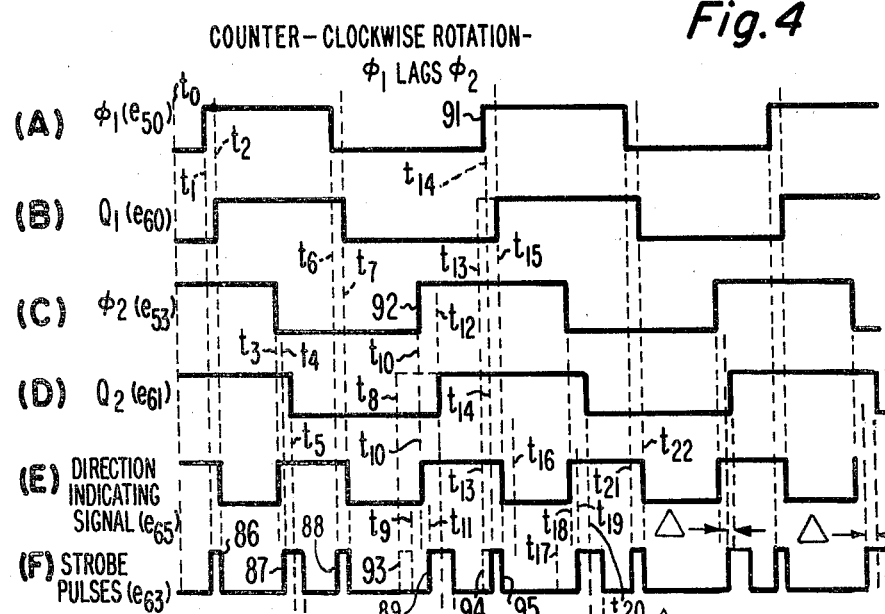
Fig.5
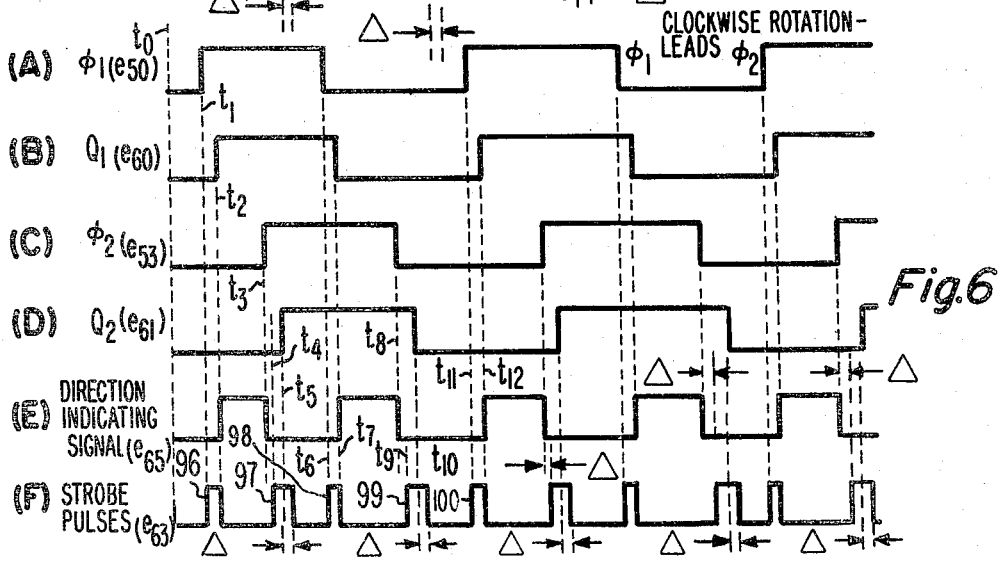
Fig.6

INCREMENTAL ENCODER FOR MEASURING POSITIONS OF OBJECTS SUCH AS ROTATING SHAFTS

This invention related generally to incremental encoders of the type employed to track the position of a moving object such as a bi-directionally rotatable disc and more particularly to a circuit for determining the phase relationship of a pair of two-level signals of equal frequency produced by said moving object upon the occurrence of each level transition of both of said signals.

Prior art systems have been devised which detect the leading or lagging phase relationship of the two signals at the time of each level transition of both of the two signals. These prior art devices accomplish their result by, in effect, dividing the two signals into four quadrants for each complete cycle of operation. More specifically, the logic level of the two signals will have four relationships, e.g. when they are both high, when they are both low, and when one is high and the other is low. Such prior art devices further contain logic which remembers at least the two immediately prior permutations of logic levels in addition to the one in which a determination of the phase relationship of the two signals at a level transition is to be made. These prior art devices are complex and require a relatively large amount of logic in order to remember the two prior level states as well as the one in which the decision is made, and then to decide from such information the proper interpretation of the level transition in the state being considered. Such complex logic is expensive and therefore prohibitive in many applications. Further, because of the complexity, the time required for the circuit to make a decision is longer than would be required for a system having fewer components, and therefore functions more slowly to further limit the number of feasible applications.

The present invention provides an improved and simplified circuit wherein every positive-going and negative-going level transitions of both two-level signals produce incrementing or decrementing pulses in accordance with the phase relation of the two signals at the time of occurrence of each level transition.

In accordance with a preferred form of the invention, there is provided first and second signal level storage means each having a data input terminal, a clock input terminal, and an output terminal, and constructed to store a signal logic level supplied to its data input terminal and further constructed to cause the signal logic level of its output terminal to become equal to the signal logic level of its data input terminal in response to a clock signal supplied to its clock input terminal. Further provided are first and second voltage comparator means each having a first input terminal means for receiving first and second input signals, respectively, a second input terminal means connected respectively to said output terminals of said first and second signal level storage means and responsive to equal and non-equal signal levels supplied to said first and second input terminal means to produce first and second output signal logic levels, respectively. A third voltage comparator means is responsive to equal and non-equal signal logic levels on said output terminal of said first signal level storage means and said second input signal to produce first and second output signal logic levels, respectively. Other means are responsive to the output signal levels on said first, second and third voltage comparator means to determine the leading or lagging phase relation of said first and second input signals at each level transition thereof, and further to supply a clock pulse to said clock input terminals of said first and second signal level storage means a predetermined time interval after the determination of said leading or lagging phase relation of said first and second input signals at each logic level transition.

In the drawings:

FIG. 3 shows an alternative means for processing the signals generated in the logic diagram of FIG. 2;

FIG. 4 shows another alternative means for processing the signals generated in the logic diagram of FIG. 2;

FIG. 5 is a first set of waveforms showing the signals generated at various points in the logic diagram of FIG. 2 with a given phase relation of the two signals being compared; and FIG. 6 is another set of waveforms showing the signals generated at various points in the logic diagram of FIG. 2 when the phases of the two signals being compared are reversed.

Figure 1:
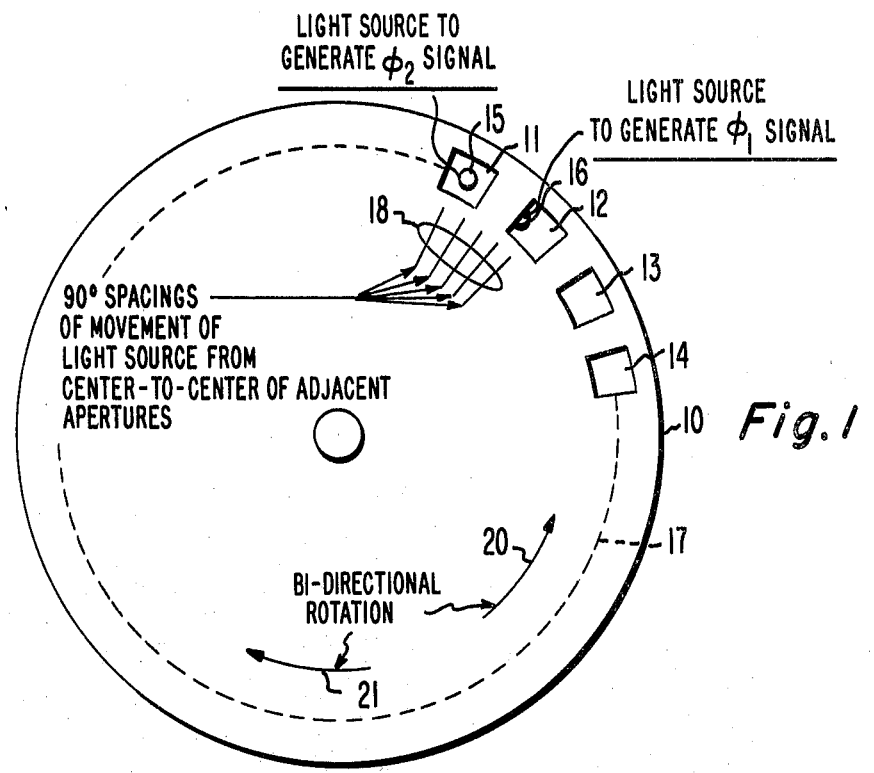
FIG. 1 shows a rotatable disc with apertures around the perimeter thereof for generating first and second direction indicating two-level signals with leading or lagging phase relationship.

Referring now to FIG. 1 there is shown a prior art means for generating a pair of two-level signals which have either a leading or lagging phase relationship. The disc 10 has a circular row of apertures 17 formed around the perimeter thereof, such as the individual apertures 11, 12, 13, and 14. A pair of light sources 15 and 16 are positioned adjacent the apertures to project a beam of light through said apertures to photo-electric devices (not shown) as the disc 10 is rotated. The two lights source 15 and 16 are positioned in such a manner that one of the lights sources 15 will be centered in an aperture, such as aperture 11, at the time the other light source 16 is just crossing the edge of another aperture 12 and into said aperture 12. Thus, if the disc 10 is rotating in the counter-clockwise direction, as indicated by arrow 20, the signal $\phi_2$ produced by light source 15 will lead the phase of the signal $\phi_1$ produced by light source 16 to produce the signals $\phi_1$ and $\phi_2$ shown in waveforms A and C of FIG. 5.

Specifically, waveform A of FIG. 5, designated as signal $\phi_1$, is generated by light source 16 of FIG. 1 and signal $\phi_2$, shown in waveform B of FIG. 5, is generated by light source 15 of FIG. 1. It is to be noted that while signals $\phi_1$ and $\phi_2$ are shown as being in phase quadrature it is not necessary that they be so. It is only necessary that there be a leading and lagging phase relationship.

When the rotation of disc 10 is reversed to rotate in the direction of arrow 21 (clockwise), the phase of the signal $\phi_1$ produced by light source 16 will lead the phase of the signal $\phi_2$ produced by light source 15, as shown in waveforms A and C of FIG. 6.

Figure 2:
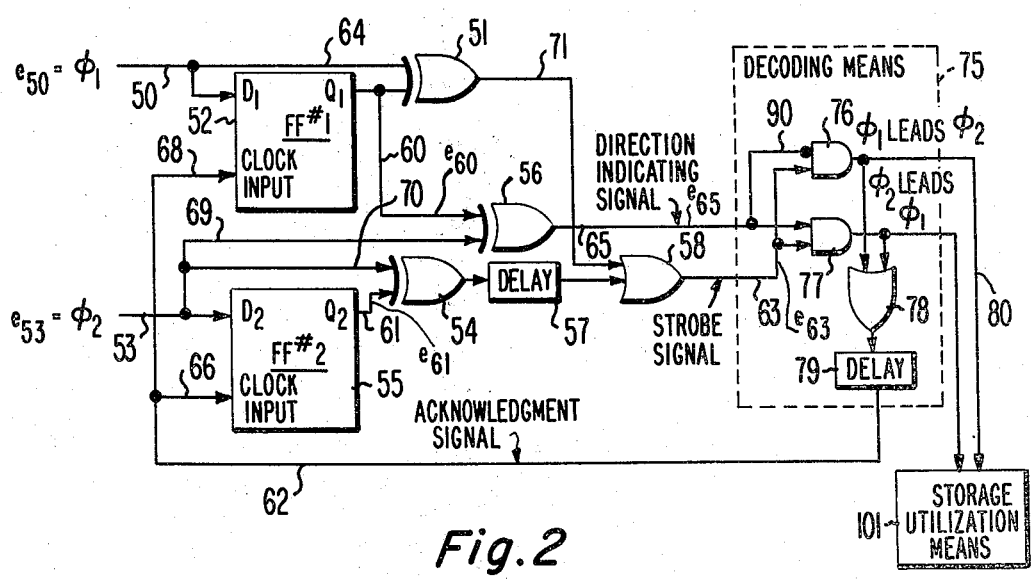
FIG. 2 shows a diagram of a preferred form of the invention.

Referring now to FIG. 2 the two received input signals $\phi_1$ and $\phi_2$ are supplied to first input terminals 64 and 70 of Exclusive OR gates 51 and 54. The $Q_1$ and $Q_2$ output terminals of conventional D type flip-flops 52 and 55 are supplied to the second input terminals of Exclusive OR gates 51 and 54. As will be discussed in detail later, Exclusive OR gates 51 and 54 produce output pulses defined herein as strobe pulses (shown in waveforms F of FIGS. 5 and 6) upon each transition of input signals $\phi_1$ and $\phi_2$, respectively. Such strobe signals are supplied through OR gate 58 to decoding means 75, the operation of which will be discussed in detail later herein but which in effect records such level transitions. Exclusive OR gate 56 responds to the input signals supplied to its two input terminals to supply a direction or phase relation indicating signal to decoding means 75 which responds thereto to determine the phase relationship between input signals $\phi_1$ and $\phi_2$ at the occurrence of each level transition thereof. A signal acknowledging each strobe pulse is supplied from decoding means 75 back to the clock inputs 68 and 66 of flip-flops 52 and 55 to prepare the circuit for the occurrence of the next level transition as will be discussed in detail later herein.

Consider next the operation of the circuit of FIG. 2 with respect to the waveforms of FIG. 5 wherein the input signal $\phi_1$ lags the input signal $\phi_2$ as shown in waveforms A and C of FIG. 5 and the disc 10 of FIG. 1 is rotating in a counter-clockwise direction.

In the discussion of the operation of the circuit of FIG. 2 with the waveforms of both FIGS. 5 and 6, the waveforms will be identified by the figure number plus the letter to the left of the waveform. Thus, waveform A in FIG. 5 will be designated as waveform 5A. Further, each of the waveforms has a voltage notation at the left side thereof. Thus, waveform 5A has the voltage notation $e_{50}$ at the left thereof which indicates that waveform 5A is the voltage signal appearing on input lead 50 of the logic diagram of FIG. 2. Similarly, in waveform 5B, the voltage $e_{60}$ is the voltage appearing on the $Q_1$ output 60 of flip-flop 52 of FIG. 2.

Assume further the initial conditions existing at time $t_0$ in FIG. 5, at which time $\phi_1$ and $Q_1$ are at their low levels and $\phi_2$ and $Q_2$ are at their high levels. $Q_1$ and $Q_2$ represent the outputs of flip-flops 52 and 55, respectively, of FIG. 2 and are further identified as signal levels $e_{60}$ and $e_{61}$, respectively.

The direction indicating signal $e_{65}$ is high at time $t_0$ and there is not strobe pulse $e_{63}$ on lead 63 present at time $t_0$.

At time $t_1$, $\phi_1$ (waveform 5A) goes from its low to its high level to produce an output pulse at the output terminal 71 of Exclusive OR gate 51 (FIG. 2) since the voltage levels supplied to the two inputs thereof are now non-equal, i.e. of different signal logic levels since $Q_1$ is low. The positive-going voltage change on output terminal 71 of Exclusive OR gate 51 is supplied through OR gate 58 to first inputs of AND gates 76 and 77 as a strobe or clock signal represented by pulse 86 of waveform 5F. Further, at time $t_1$, the output signal of Exclusive OR gate 56, which is the direction indicating signal $e_{65}$ of waveform 5E, is at its high level since the signal level $e_{60}$ supplied to one of its input terminals is at a low level and the input signal $\phi_2$ supplied to its other input terminal is at a high level. Thus, AND gate 77 is primed to permit the strobe signal 86 of waveform 5F to pass therethrough, through OR gate 78, delay means 79, and then back to the clock input terminal 66 of the conventional D-type flip-flop means 52 to cause the signal level on the $Q_1$ output of flip-flop 52 to become equal to the signal level ($\phi_1$) supplied to the D input thereof on input lead 50.

Thus, at time $t_2$, $Q_1$ goes from its low to its high level, as shown in waveform 5B, which will cause the output of Exclusive OR gate 56 to go from its high to its low level since the signal level on both inputs thereof are now at high levels.

It will be noted from the foregoing discussion that when the level of $\phi_1$ changed from its low to its high level at time $t_1$ two subsequent changes in the circuit occurred. The first change was that the signals levels to the Exclusive OR gate 51 became unequal to produce a strobe signal which was supplied through OR gate 58 to the decoding means 75. Then an acknowledgment pulse but, generated in decoding means 75, was supplied back to the clock input 68 of flip-flop 52 to change the signal on its $Q_1$ output from its low to its high level, thereby causing the two input signals to Exclusive OR gate 56 to become equal and thereby change the output signal $e_{65}$ of Exclusive OR gate 56 from its high to its low level at time $t_2$.

The direction indicating signal $e_{65}$ is now at its low level, which is the wrong level to properly indicate the counter clockwise direction of motion of the disc 10 (FIG. 1) at the next transition of an input signal, which occurs in input signal $\phi_2$ at time $t_3$. Therefore, it is necessary that the level of the direction indicating signal $e_{65}$ be changed back to its high level before the strobe pulse generated by the level transition of $\phi_2$ at time $t_3$ occurs.

To effect the foregoing, the strobe pulse 87, which ultimately appears at the output of OR gate 58 due to the level transition of $\phi_2$ at time $t_3$ is delayed until after the direction indicating signal $e_{65}$ is changed to its high level, as shown in waveform 5E at time $t_3$. More specifically, at time $t_3$, when $\phi_2$ changes from its high to its low level, the direction indicating output signal $e_{65}$ from Exclusive OR gate 56 will change from its low to its high level since the signal levels supplied to the two inputs thereof are unequal.

At the same time $t_3$, the output of Exclusive OR gate 54 will change from its low to its high level since the signal levels supplied to the two inputs thereto are also unequal. Specifically, the signal level on lead 70 has changed from a high to a low level whereas the output signal level of $Q_2$ remains at a high level as shown at time $t_3$ in waveform 5D. However, due to the delay means 57, the strobe signal 87 generated at the output of Exclusive OR gate 54 is delayed until time $t_4$ as indicated in waveform 5F.

Thus, it can be seen that the strobe signal 87 generated as a result of a level transition of $\phi_2$ at time $t_3$ is delayed until after the direction indicating signal has changed whereas in the case of a level transition of input signal $\phi_1$ the strobe signal generated thereby precedes a change in the direction indicating signal produced by such level change.

The foregoing order of events is necessary since the change in level of direction indicating signal $e_{65}$ produced by a level change of $\phi_1$ indicates a direction of rotation of the disc 10 (FIG. 1) opposite to that which is actually occurring. Therefore, it is necessary that the direction indicating signal $e_{65}$ be changed back to its high level prior to the occurrence of the strobe pulse produced by a level transition of input signal $\phi_2$.

The strobe pulse 87 of waveform 5F is supplied from the output of OR gate 58 (FIG. 2) through AND gate 77, primed by the positive level of the direction indicating signal $e_{65}$, OR gate 78, delay means 79, and the back to the clock input terminal 66 of flip-flop 55 to cause the signal level of $Q_2$ to become equal to the signal level to the $D_2$ input 53. Such $D_2$ input signal level is the same level as the input signal $\phi_2$ at time $t_5$, which is a low level signal. The change in level of the $Q_2$ output voltage $e_{61}$ results in a change from a high to a low level of the output signal of Exclusive OR gate 54 which produces no effect on either AND gate 76 or AND gate 77 in decoding means 75 since it is a negative-going signal.

The next level transition occurs when $\phi_1$ goes from its high to its low level at time $t_6$ to produce a strobe output signal 88 of waveform 5E at the output of Exclusive OR gate 51. As discussed above such strobe pulse 88 is produced as a result of the input signal $e_{64}$ to Exclusive OR gate 51 changing levels while the $Q_1$ output of flip-flop 52 does not change levels until the acknowledgment pulse is supplied back to clock input terminal 68 thereof from decoding means 75.

Such acknowledgment signal is received back at time $t_7$ to change the signal on the $Q_1$ output of flip-flop 52 to that of data input $D_1$. Thus, the output of Exclusive OR gate 51 goes from its high to its low level at time $t_7$ and the direction indicating output voltage $e_{65}$ of Exclusive OR gate 56 goes from its high to its low level since the levels of the signals supplied to the two inputs thereof are now equal. Specifically, the signal level on lead 60 goes to its low level and $\phi_2$ supplied to lead 69 is also at a low level.

Then, at time $t_{10}$, the next level transition occurs when $\phi_2$ goes from its low to its high level as shown in waveform 5C. At the same time $t_{10}$ the direction indicating signal $e_{65}$ of waveform 6E is caused to go from its low to its high level since the level of the two signals supplied to the two inputs of Exclusive OR gate 56 are now unequal. A short time later at time $t_{11}$, determined by delay means 57, a strobe signal 89 is generated at the output of OR gate 58 due to the change of level on input terminal 70 of Exclusive OR gate 54. Next, at time $t_{12}$ an acknowledgment signal (not specifically shown) is supplied from decoding means 75 back to the clock input terminal 66 of flip-flop 55 via lead 62 to cause the level of signal $e_{61}$ on $Q_2$ output 61 thereof to become equal to the level signal $\phi_2$ on the $D_2$ input 53, which is then at a high level signal as shown in waveform 5C.

The cycle of operation is completed at the next level transition at time $t_{14}$ when $\phi_1$ goes from its low to it high level. Such level transition is followed by a strobe signal 95 generated at the output of Exclusive OR gate 51 and which is supplied to decoding means 75 through OR gate 58. An acknowledgment pulse (not specifically shown) is then generated in decoding means 75 and supplied back to clock input 68 of flip-flop 52. Such acknowledgment signal functions to cause the voltage level $e_{60}$ of $Q_1$ to be equal to that of $D_1$ input terminal 50 at time $t_{15}$, as shown in waveform 5B.

Assume now that the disc 10 of FIG. 1 has moved to a position corresponding to time $t_{16}$ in FIG. 5 and further that the disc 10 (FIG. 1) has stopped at time $t_{16}$ but then begins to oscillate back and forth across the transition of $\phi_1$ occurring at time $t_{14}$. To accurately track the position of the disc 10, it is necessary that the motion of the disc in the reverse (clockwise) direction be recorded as crossing a level transition in said reverse direction.

The foregoing occurs as follows. As the disc 10 of FIG. 1 begins to rotate in the reverse (clockwise) direction at time $t_{16}$, the direction indicating signal $e_{65}$ is at its low level. As the disc 10 (FIG. 1) continues to rotate in said reverse direction, nothing will occur to change the direction indicating signal $e_{65}$ until after the level transition 91 of $\phi_1$ (waveform 5A) occurs. At such level transition 91 at time $t_{14}$, a strobe pulse 94 of waveform 5F is generated at the output of Exclusive OR gate 51 and supplied through OR gate 58 to decoding means 75. Since the direction indicating signal $e_{65}$ is at its low level at this time $t_{14}$, AND gate 76 will be enabled and AND gate 77 will be disabled so that strobe pulse 94 will appear on the output terminal 80 of AND gate 76 indicating that $\phi_1$ leads $\phi_2$, the criteria-defining motion of disc 10 in said reverse (clockwise) direction.

The strobe pulse 94 will be supplied from AND gate 76 through OR gate 78, delay means 79, and then back to the clock input terminal 68 of flip-flop 52 to cause the voltage level of $Q_1$ to become equal to the low level of input $D_1$ at time $t_{13}$, as is shown in waveform 5B. Since $\phi_2$ is a high level signal at time $t_{13}$ the output of Exclusive OR gate 56 in FIG. 2 will also be a high level signal, thereby preparing the system to record a motion in the counterclockwise direction if the disc should then oscillate back again across the transition 91 of $\phi_1$ in a counterclockwise direction, i.e. going to the right in the waveforms of FIG. 5.

Should, however, the disc continue moving clockwise it will cross the transition 92 of $\phi_2$ at time $t_{10}$, as shown in waveform 5C. As discussed above, however, the strobe signal 93 generated as a result of a level transition of $\phi_2$ at time $t_{10}$ would be delayed until after the direction indicating signal $e_{65}$ (waveform 5E) has changed levels. Thus, the direction indicating signal of waveform 5E would change to its low level at time $t_{10}$ coincident with the level change of $\phi_2$, said direction indicating signal appearing at the output of Exclusive OR gate 56 as discussed hereinbefore.

However, the strobe pulse 93 generated at the output of Exclusive OR gate 54 due to the level change of $\phi_2$ at time $t_{10}$ is delayed by delay means 57. Thus, when the strobe pulse 93 is supplied to decoding means 75 at time $t_9$, the direction indicating signal $e_{65}$ is at its low level so that strobe pulse 93 is interpreted in decoding means 75 as representing an increment of motion in the clockwise direction of the disc, i.e. when $\phi_1$ leads $\phi_2$ in phase.

A complete set of waveforms illustrating the signals at various points in the circuit of FIG. 2 when the disc is rotating in a clockwise direction, e.i. when $\phi_1$ leads $\phi_2$ is show in the waveforms of FIG. 6.

In the operation of the circuit as represented by the waveforms of FIG. 6 assume that the initial conditions are as shown at time $t_0$ when $\phi_1$, $\phi_2$, $Q_1$, $Q_2$, and also the direction indicating signal $e_{65}$ (waveform 6E) are all at their low levels. A low level of $e_{65}$ indicates clockwise rotation.

Thus, at time $t_1$ when $Q_1$ changes from its low to its high level, a strobe pulse 96 is generated at the output of Exclusive OR gate 51 which is supplied through OR gate 58 and then through primed AND gate 76 of decoding means 75. AND gate 76 is primed since the output of Exclusive OR gate 56 is at a low level which is inverted at the input 90 of AND gate 76.

An acknowledgment pulse is then supplied through OR gate 78, delay means 79, and back to the clock input terminal 68 of flip-flop 52 to cause the voltage level of $Q_1$ to become equal to that of $D_1$ which is now a high level signal as indicated at time $t_1$ of waveform 6A.

The change of $Q_1$ to a high level at time $t_2$ results in the signal level to both inputs of Exclusive OR gate 51 becoming equal so that the output of Exclusive OR gate 51 is at a low level, thus terminating the strobe pulse 96 of waveform 6F.

At time $t_3$, $\phi_2$ changes from its low to its high level to change the level of the direction indicating signal $e_{65}$ from its high to its low level since the signal levels supplied to the two inputs of Exclusive OR gate 56 become equal at time $t_3$. However, the strobe pulse 97 generated at the output of Exclusive OR gate 54 is delayed by delay means 57 until time $t_4$ so that such strobe pulse 97 occurs after the direction indicating signal $e_{65}$ has changed to its low level, thereby indicating a clockwise rotation of the disc 10 of FIG. 1.

At time $t_5$, the acknowledgment pulse from decoding means 75 is supplied back to the clock input terminal 66 of flip-flop 55, thereby causing the voltage level of $Q_2$ to become equal to that of the $D_2$ input terminal 53. Thus, the output of Exclusive OR gate 54 goes to its low level to terminate the strobe pulse 97 at time $t_5$.

The next voltage level transition occurs at time $t_6$ when $\phi_1$ changes from its high to its low level, thereby producing and supplying a strobe pulse 98 from the output of Exclusive OR gate 51 through OR gate 58 to decoding means 75. Since the direction indicating signal $e_{65}$ is low at time $t_6$, such strobe pulse 98 indicates rotation in the clockwise direction. The acknowledgment pulse (not shown) is supplied at time $t_7$ from decoding means 75 back to the clock input terminal 68 of flip-flop 52 to cause the voltage level of $Q_1$ to become equal to that of input terminal $D_1$ and thereby cause the voltage level at the output of Exclusive OR gate 51 to go to its low level, thus terminating the strobe pulse 98 at time $t_7$.

At time $t_8$, $\phi_2$ changes from its high to its low level to cause an immediate change of the direction indicating signal $e_{65}$ from its high to its low level in the manner discussed above. Subsequently, at time $t_9$, strobe pulse 99 is supplied from the output of Exclusive OR gate 54, through delay means 57 and OR gate 58 and then through primed AND gate 76 of decoding means 75. Next, at time $t_{10}$, an acknowledgment pulse (not shown) is supplied back from the output of delay means 79 to the clock input pulse terminal 66 of flip-flop 55 to cause the voltage level of $Q_2$ to become equal to that of $D_2$, thereby causing the output of Exclusive OR gate 54 to go to its low level and terminate the strobe pulse 99.

The cycle of operation is completed at time $t_{11}$ when $\phi_1$ again changes from its low to its high level. Since the direction indicating signal $e_{65}$ is at its low level at time $t_{11}$, the strobe pulse 100 will indicate rotation of disc 10 of FIG. 1 in the clockwise direction. Subsequently, at time $t_{12}$, an acknowledgment signal is supplied back from decoding means 75 to the clock input terminal 68 of flip-flop 52 to cause the voltage level of $Q_1$ to become equal to that of $D_1$. Thus, the output of Exclusive OR gate 56 goes to its high value at time $t_{12}$, as indicated in waveform 6E. Also, the strobe pulse 100 is terminated at time $t_{12}$ as shown in waveform 6F.

The flip-flop circuits 52 and 55 of FIG. 2 need not be flip-flop circuits. The requirements of the logic blocks 52 and 55 are that they are able to receive and store a signal level supplied to a first (data) input terminal and then to transfer said signal level to an output terminal (Q) upon the reception of a clock pulse at a clock input terminal. Logic means other than conventional D-type flip-flops are available to perform this function or, alternatively, can be designed by one skilled in the art.

The decoding means 75 and the storage and utilization means 101 can be performed by a means other than that shown in FIG. 2. For example, the microprocessor 85 shown in FIG. 3 can be employed to perform the decoding, storage and utilization functions in response to the direction indicating signal $e_{65}$ and the strobe signal $e_{63}$ on leads 63, and also to generate acknowledgment signals on lead 62.

In another alternate form of decoding means shown in FIG. 4, a bi-directional counter 105 can be employed to decode the direction indicating signal $e_{65}$ and the strobe signal $e_{63}$ and to count upwardly or downwardly in response to each strobe signal in accordance with the polarity of the direction indicating signal $e_{65}$. The acknowledgment signal (not specifically shown) can be generated from the least significant bit position of the bi-directional counter output terminals 110 by various means such as that shown within the dotted block 106. Within dotted block 106, there is a pulse generating circuit comprised of resistor 108, capacitor 109, and Exclusive OR gate 107. Each time the output of the least significant bit position 111 changes polarity, resistor 109 will require some time to charge to the new polarity, whereas the change of signal level will be supplied directly to the other terminal 112 of the Exclusive OR gate 107. Thus, during the interval of time required for capacitor 109 to charge, the voltage level supplied to the two input terminals of Exclusive OR gate 107 will be different so that a positive pulse will appear on the output thereof. This positive pulse is the acknowledgment signal and occurs with each change of the contents of the least significant bit position 111 of bi-directional counter 105.

What is claimed is:

1. A circuit for determining each level transition of first and second two logic level input signals and their leading or lagging phase relationship at each level transition and comprising:

first and second signal level storage means each having first, second and third terminals and responsive to a clock pulse supplied to its third terminal to cause the signal logic level on its second terminal to become equal to the signal logic level on its first terminal;

first and second voltage comparator means each having a first input terminal means connected respectively to said first terminal of said first and second signal level storage means, respectively, and constructed to receive, respectively, said first and second input signals, a second input terminal means connected respectively to said second terminal of said first and second signal logic level storage means, and responsive to equal or non-equal signal logic levels supplied to their first and second input terminal means to produce first and second output signal logic levels, respectively;

third voltage comparator means responsive to the equality or non-equality of the signal logic level on said second terminal of said first signal level storage means and said second input signal to produce third and fourth output signal levels, respectively;

clock pulse generating means for generating clock pulses;

first means responsive to the output signal logic levels of said first, second, and third voltage comparator means to detect each logic level transition of said first and second input signals and the leading or lagging phase relation of said first and second input signals at each logic level transition thereof; and second means for supplying said clock pulses to said third terminal means of said first and second signal level storage means a predetermined time interval after said first means detected said leading or lagging phase relationship of said first and second input signals.

2. A circuit as in claim 1 in which said first means comprises:
   bi-directional counting means responsive to said each level transition to count in first and second directions, respectively, when the output signal of said third voltage comparator means indicates, respectively, a leading or lagging phase relationship between said first and second input signals.

3. A circuit as in claim 1 wherein each of said signal level storage means is a D-type flip-flop circuit in which:
   said first terminal is a data (D) input terminal;
   said second terminal is an ouput (Q) terminal; and
   said third terminal is a clock pulse input terminal.

4. A circuit as in claim 1 in which:
   said first means comprises decoding means for producing a first train of pulses in response to each level transition of said first and second input signals when the output signal of said third voltage comparator means is at a first logic level and a second train of pulses in response to each level transition when the output signal of said third voltage comparator means is at a second logic level;
   in which said second means comprises logic means responsive to said first means to generate said clock pulses; and
   further comprising means for storing the number of pulses in said first and second trains of pulses.

5. A circuit as in claim 1 in which said first and second means comprise data processing means.

6. A circuit for detecting each level transition of first and second two-level input signals and their leading or lagging phase relationship at each level transition, and comprising:
   first and second signal level storage means each having a data input terminal for receiving said first and second input signals, respectively, a clock input terminal, and a first output terminal and constructed to store a signal level supplied to its data input terminal and to cause the signal level on its output terminal to become equal to the signal level on its data input terminal in response to a signal supplied to said clock input terminal;
   first and second Exclusive OR gate means each having a first input terminal for receiving, respectively, said first and second input signals, a second input terminal connected, respectively, to said first output terminals of said first and second signal level storage means, and a second output terminal;
   third Exclusive OR gate means responsive to the signal level on said first output terminal of said first signal level storage means and to said second input signal to produce an output signal indicative of the phase relationship of said first and second input signals at the last occurring level transition;
   first means responsive to the output signals appearing on the output terminals of said first, second and third Exclusive OR gate means to determine the phase relationship of said first and second input signal at each level transition thereof; and
   second means for supplying a clock pulse to said clock input terminals of said first and second level storage means after each level transition of said first and second input signals.

7. A circuit as in claim 6 in which said first means comprises:
   bi-directional counting means responsive to said each level transition of said first and second input signals to count in first and second directions, respectively, when the output signal of said third Exclusive OR gate means indicates, respectively, a leading or lagging phase relationship between said first and second input signals.

8. A circut as in claim 6 in which:
   said first means comprises decoding means for producing a first train of pulses in response to each level transition of said first and second input signals when the output signal of said third Exclusive OR gate means is at a first level and a second train of pulses in response to each level transition when the output signal of said third Exclusive OR gate means is at a second level:
   in which said second means comprises logic means responsive to said first means to generate said clock pulses; and
   further comprising means for storing the number of pulses in said first and second trains of pulses.

9. A circuit as in claim 6 in which said first and second means comprise data processor means.

* * * * *